United States Patent [19]

Sakamoto

[11] 3,781,699

[45] Dec. 25, 1973

[54] DIFFERENTIAL AMPLIFIER CIRCUIT

[75] Inventor: Yoshio Sakamoto, Tokyo, Japan

[73] Assignee: Hitachi, Ltd., Tokyo, Japan

[22] Filed: Sept. 27, 1972

[21] Appl. No.: 292,785

[52] U.S. Cl. .................... 330/30 D, 330/22, 330/26, 330/69

[51] Int. Cl. .................... H03f 3/68

[58] Field of Search .................... 330/15, 22, 30 D, 330/40, 69, 32, 26

[56] References Cited

UNITED STATES PATENTS 3,721,914 3/1973 Nakamura .................... 330/30 D X

*Primary Examiner*—Roy Lake
*Assistant Examiner*—Lawrence J. Dahl
*Attorney*—Paul M. Craig, Jr. et al.

[57] ABSTRACT

A differential amplifier circuit which comprises an emitter follower transistor adapted to operate at the same time the power supply is turned on, the output of said transistor being fed to the first input of the differential amplifier and servicing to charge a capacitor connected to the second input of said differential amplifier, whereby the rise of the output signal is made quick and the so-called pop signal normally produced in the amplifier is eliminated.

4 Claims, 4 Drawing Figures

DIFFERENTIAL AMPLIFIER CIRCUIT

The present invention relates to a differential amplifier circuit, and more particularly to a differential amplifier circuit in which the rise time of an output signal is shortened upon closure of the power supply so as to eliminate the initial noise, known as a pop signal or pop tone which results from an abrupt rise of the output signal upon initial energization of the circuit.

As will be described in detail hereinafter, prior art differential amplifier circuits are generally disadvantageous as a result of noise generated therein due to the rise characteristics of the output signal thereof.

An object of the present invention is to provide a differential amplifier circuit in which the output signal has a rise time which avoids generation of troublesome noise of type inherently provided by the known arrangements.

Another object of the present invention is to provide a differential amplifier circuit which is free from sudden rise of the output signal upon connection of the amplifier to the power supply.

The invention will be fully understood from the following detailed description taken in conjunction with the accompanying drawings, in which.

Figure 1:
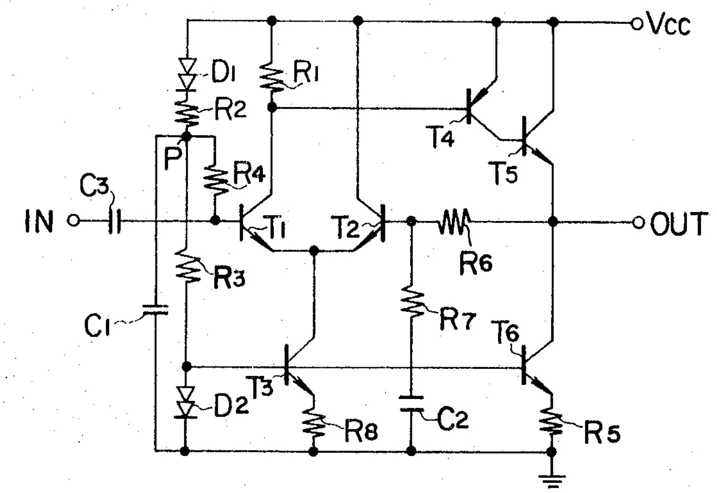
FIG. 1 is a schematic circuit diagram showing a prior art differential circuit.

Referring to FIG. 1, which shows a prior art differential amplifier circuit, $T_1$ and $T_2$ designated the first and second transistors for the differential operation which have substantially equal characteristics. A third transistor $T_3$ serves as a constant current source for the first and second transistors. A load resistor $R_1$ is connected between the collector electrode of the first transistor $T_1$ and a power supply terminal $V_{cc}$. The first to third transistors $T_1$ to $T_3$ and the resistor $R_1$ constitute a differential amplifier. Diodes $D_1$, $D_2$ and resistors $R_2$, $R_3$ constitute a series circuit, which is connected between the power supply terminal $V_{cc}$ and ground.

A resistor $R_4$ is connected between the base electrode of the first transistor $T_1$ and the intersection point of the resistors $R_2$ and $R_3$, and serves to supply a bias current to the first transistor $T_1$. A capacitor $C_1$, provided for absorbing ripples, is connected between the connection point of the resistors $R_2$ and $R_3$ and ground. The fourth transitor $T_4$ has its base electrode connected to the collector electrode of the first transistor $T_1$, while the fifth transistor $T_5$ has its base electrode connected to the collector electrode of the fourth transistor $T_4$. The fourth and fifth transistors $T_4$ and $T_5$ are connected in the well-known Darlington configuration, and effect an operation equivalent to that of a single P-N-P transistor. A sixth transistor $T_6$ serves as the load of the Darlington transistor $T_5$. A resistor $R_5$ is connected between the emitter electrode of the sixth transistor $T_6$ and ground in order to set the operation point of the sixth transistor $T_6$ at an appropriate value. The fourth to sixth transistors $T_4$ to $T_6$ and the resistor $R_5$ constitute an inverter.

A feedback element $R_6$ is connected between the base electrode of the second transistor $T_2$ and the emitter electrode of the fifth transistor $T_5$ in order to feed a bias current to the second transistor $T_2$ and to apply negative feedback to the circuit. A capacitor $C_2$ is employed for the purpose of cutting or blocking direct current. A resistor $R_7$ is connected between the base electrode of the second transistor $T_2$ and ground through the capacitor $C_2$. The resistors $R_6$ and $R_7$ and the capacitor $C_2$ constitute a feedback path. "IN" indicates an input terminal which is connected to the base electrode of the first transistor $T_1$ through a capacitor $C_3$, while "OUT" represents an output terminal which is connected to the emitter electrode of the fifth transistor $T_5$. When the circuit arrangement is operated, a signal source (not shown) is connected between the input terminal IN and ground. Usually, this signal source has a low impedance.

Changes in voltage and current at various circuit parts, in the circuit arrangement thus described, before a normal operation state is reached after the supply voltage $V_{cc}$ is turned on, are as stated below.

Upon the closure of the power supply $V_{cc}$, electric potentials at various points of the circuit consisting of the diodes $D_2$, $D_2$, the resistors $R_2$, $R_3$, $R_4$ and the capacitors $C_1$, $C_3$ are first changed. The first transistor $T_1$ does not cause any collector current to flow before its base voltage becomes larger than its threshold voltage between the base and ground. Accordingly, the Darlington circuit $T_4$, $T_5$ having the terminal voltage of the resistor $R_1$ and its input bias receives no bias voltage at its base on the input side for some time after the closure of the power supply. The potential of the collector side of the circuit, i.e., the potential of the output terminal OUT is therefore zero. The base potential of the second transistor $T_2$ is also zero.

The capacitors $C_1$ and $C_3$ are charged, so that the base potential of the first transistor $T_1$ eventually exceeds the threshold voltage. Then, a collector current starts flowing through the transistor $T_1$. The base potential of the second transistor $T_2$ is still zero at this time, so that all the current of the differential amplifier circuit flows through the first transistor $T_1$. That is to say, the collector current of the first transistor $T_1$ is nearly twice as large as in the normal operation of the amplifier. For this reason, the input side base of the Darlington circuit $T_4$, $T_5$ is strongly biased, to cause an abrupt rise in the potential of the output terminal OUT to a value approximately equal to the supply voltage $V_{cc}$.

The capacitor $C_2$ of the base circuit of the second transistor $T_2$ has started charging through the resistors $R_6$ and $R_7$ simultaneously with the generation of the voltage of the output terminal OUT.

With the charging of the capicitor $C_2$, the base potential of the second transistor $T_2$ rises. When the potential approaches the base potential of the first transitor $T_1$, the second transistor $T_2$ is rendered conductive. If $R_1$ is approximately twice as large as $R_8$ in resistance, the collector current of the second transistor $T_2$ is finally made nearly equal to that of the first transistor $T_1$. In the course of further operation in which the values of the collector currents of the transistors $T_1$ and $T_2$ become equal, the bias voltage for the input side base of the Darlington circuit $T_1$, $T_2$ approaches gradually the normal or steady state value. Thus, the potential of the output terminal OUT is finally made equal to the value of a half of the supply voltage $V_{cc}$.

Figure 2:
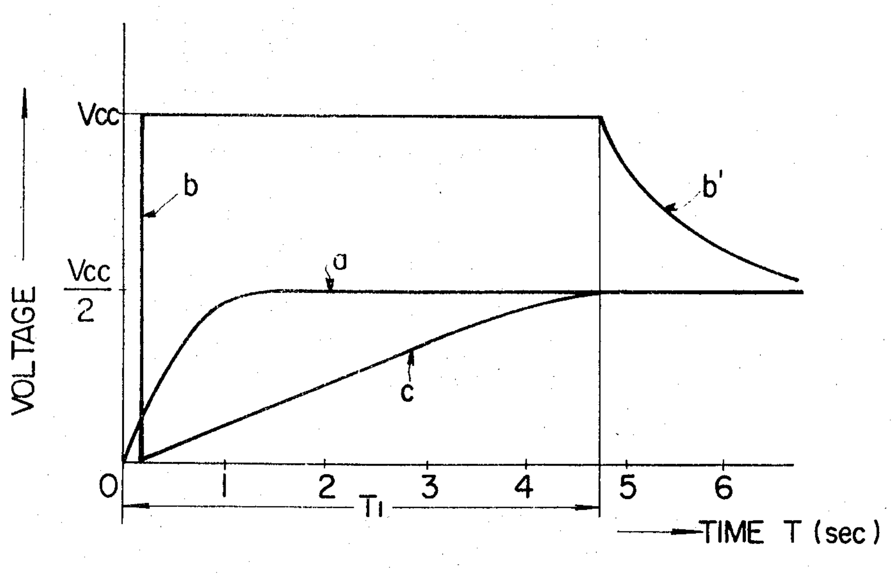
FIG. 2 is a diagram showing the waveforms of the signals at various parts of the differential amplifier circuit illustrated in FIG. 1.

FIG. 2 illustrates the transient voltage changes of the respective parts of the circuit arrangement. A curve *a* depicts the base potendial of the first transistor $T_1$, curves *b* and *b'* depict the potential of the outpout terminal OUT, and a curve *c* depicts the base potential of the second transistor $T_2$.

As illustrated in FIG. 2, amplification of a signal applied to the input terminal IN is not carried out in the above amplifier circuit within a time $t_1$ before the potential of the output terminal OUT begins to fall. A further period of time is required for the circuit to thereafter reach steady state operation. Moreover, such operation represents generation of a kind of pulse signal once the voltage of the output terminal OUT is raised to the supply voltage $V_{cc}$. This results in generation of a noise, or the so-called pop signal or pop tone, when the amplifier is used in voice frequency systems.

In the case where the amplifier deals with a low frequency, the time constant between the resistor $R_6$ and the capacitor $C_2$ constituting part of the feedback path in the circuit arrangement in FIG. 1 needs a certain lower-limit value in order to obtain a voltage gain as well as frequency characteristics as predetermined. It is therefore impossible to make $t_1$ shorter by reducing the time constant, namely, by quickening the rise of the curve *c* in FIG. 2. Is is accordingly unsuitable to try to enhance the rise characteristic at the output terminal OUT by shortening the time constant between $C_2$ and $R_6$.

A differential amplifier circuit according to the present invention will be described in detail hereunder with reference to FIGS. 3 and 4.

Figure 3:
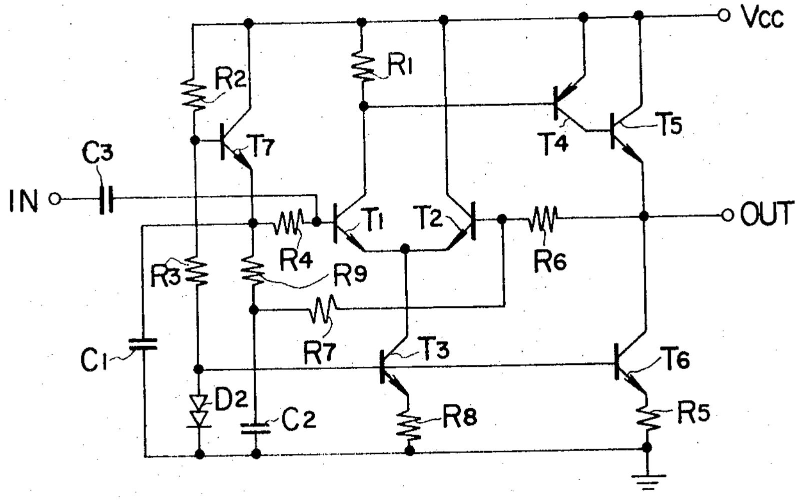
FIG. 3 is a schematic circuit diagram showing an embodiment of a differential amplifier circuit according to the present invention.
Figure 4:
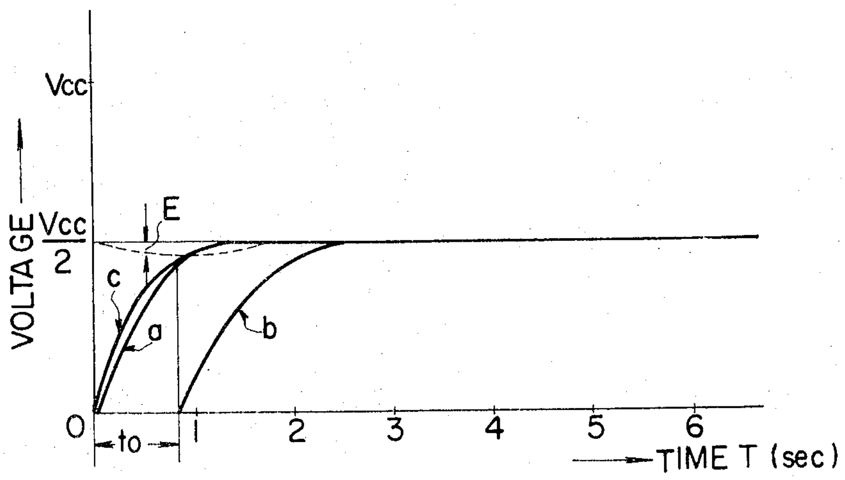
FIG. 4 shows the waveforms of the signals at various parts of the differential amplifier circuit illustrated in FIG. 3.

FIG. 3 shows an embodiment of the differential amplifier circuit according to the present invention, and it employs the same reference characters for the same parts as illustrated in FIG. 1.

Referring to FIG. 3, $T_7$ designates a seventh transistor whose input terminal is at the connection point between the resistors $R_2$ and $R_3$ and whose output terminal is at its emitter. A resistor $R_9$ is connected between the connection point of the resistor $R_7$ and the capacitor $C_2$ and the emitter electrode of the seventh transistor $T_7$. Differences in the embodiment of the invention from the prior art circuit arrangement in FIG. 1 reside in that the output of the seventh transistor $T_7$, which operates simultaneously with closure of the power supply, is supplied as the base bias of the first transistor $T_1$, and that the capacitor $C_2$, which constitutes the direct current blocking element of the feedback path, is charged by the output of the seventh transistor $T_7$.

The operation of the circuit arrangement thus constructed will now be explained in detail.

First, the supply voltage $V_{cc}$ is fed from the power supply (not shown). Then, the seventh transistor $T_7$ is brought into the operative state by a current which flows through the series circuit consisting of the resistors $R_2$ and $R_3$ and the diode $D_2$. The output of the seventh transistor $T_7$ is supplied through the resistor $R_4$ to the capacitor $C_3$. As shown by a curve *a* in FIG. 4, base potential of the first transistor $T_1$ accordingly rises in conformity with a time constant determined by the values of the resistor $R_4$ and the capacitor $C_3$, and becomes stable at nearly ½$V_{cc}$. On the other hand, when the seventh transistor $T_7$ is operated, the output thereof charges the capacitor $C_2$ through the resistor $R_9$. The base potential of the second transistor $T_2$ is accordingly raised as shown by curve *c* in FIG. 4. The direct current blocking capacitor $C_2$ of the feedback path has started charging simutaneously with the closure of the power supply $V_{cc}$. The charging speed for the capacitor $C_2$ is determined by the product between the resistance of the resistor $R_9$ and the capacity of the capacitor $C_2$. Abrupt rise of the base potential of the second transistor $T_2$ being one of the transistors for the differential operation is contrived in the circuit arrangement in FIG. 3. The period of time from the closure of the power supply to the initiation of the normal operation of the circuit can therefore be remarkably shortened.

Under a state during which the input terminal IN is connected to a signal source (not shown), the changing speed for the capacitor $C_3$ after the closure of the power supply is determined by the product between the resistance of the resistor $R_4$ and the capacity of the capacitor $C_3$. Herein, the time constants are selected such that $R_9 \cdot C_2 \approx R_4 \cdot C_3$ but that $R_9 \cdot C_2 < R_4 \cdot C_3$. Then, the transistor $T_2$ is first operated. The base potential of the transistor $T_2$ exhibits ascending characteristics whose steady voltage is obtained by subtraction of a voltage from the emitter potential of the transistor $T_7$, the last-mentioned voltage being obtained by multiplying the sum resistance of the resistors $R_9$ and $R_7$ by the sum of the base current of the transistor $T_2$ and a current flowing through the resistor $R_6$ to ground. On the other hand, the base potential of the transistor $T_1$ exhibits ascending characteristics whose steady voltage is equal to the emitter potential of the transistor $T_7$. For this reason, even if $R_9 \cdot C_2 < R_4 \cdot C_3$, the base potential of the transistor $T_1$ catches up with that of the transistor $T_2$ after lapse of a fixed period of time, and the potential of the output terminal OUT starts rising at that time. That is, in the circuit in FIG. 3, the output terminal OUT has its potential initiated to rise after the time $t_0$ as illutstrated by curve *b* in FIG. 4. The amplifier begins amplification after the time $t_0$. In FIG. 4, the distance E between a broken line and the middle point potential ($V_{cc}/2$ level) indicates the value of a voltage drop across the resistor $R_9$.

Since the rising speeds of the base potentials of the first and second transistors $T_1$ and $T_2$ effecting the differential operation are substantially determined by the time constants $C_2 \cdot R_9$ and $C_3 \cdot R_4$, the rise of the collector current of the second transistor $T_2$ becomes quick if $C_2 \cdot R_9$ is made smaller than $C_3 \cdot R_4$ to some extent. Accordingly, no maximum point occurs in the potential change at the output terminal OUT at the closure of the power supply $V_{cc}$. With the connection in FIG. 3, the potential of the output terminal OUT is somewhat shifted from the case of FIG. 1. The problem of the shift can be solved by adjusting the circuit of $R_2$, $R_3$ and $D_2$ in such way that a diode is incorporated between $R_3$ and $D_2$.

In the embodiment, the seventh transistor $T_7$ operates as an emitter follower. When the capacitors $C_2$ and $C_3$ are charged after the closure of the power supply $V_{cc}$, the output impedance on the emitter side is sufficiently low owing to the large emitter current of the emitter follower. Accordingly, the voltage of the connection point between the resistors $R_2$ and $R_3$ is, in equivalence, connected through the almost negligible impedance to the connection point between the resistors $R_4$ and $R_9$ simultaneously with the closure of the power supply $V_{cc}$. This means that rapid charging of the capacitors $C_1$, $C_2$ and $C_3$ is realized.

In contrast, when the circuit is in the normal operation, the current flowing through the emitter of the seventh transistor $T_7$ is only slightly different from the base current to the differentially operated transistors $T_1$ and $T_2$, and is extremely small. Such decrease in the emitter current of the seventh transistor $T_7$ signifies that the emitter output impedance of the transistor in the normal operation state of the circuit arrangement rises. This results in the face that the decoupling operation with the other circuit parts as well as the ripple removing operation by the capacitor $C_1$ can be made satisfactory. For this reason, the capacitor $C_1$ is not connected to the connection point between the resistors $R_2$ and $R_3$ in the case of the embodiment, but it is connected to the emitter of the seventh transistor $T_7$.

As has been described above in accordance with the differential amplifier circuit of the present invention, a transistor for charging the capacitors is employed, so that the rise of the output potential as closure of power supply becomes much faster than in the prior art.

In addition, in accordance with the present invention, the rise of an output signal at the closure of the power supply is gradual, so that the noise (pop signal) previously generated upon the closure of the power supply in the prior art can be eliminated. Such various excellent results are attained. While the transistors in the embodiment of the invention are bipolar transistors, similar results are obtained by adopting field effect transistors.

What is claimed is:

1. A differential amplifier circuit comprising a differential amplifier having first and second inputs and an output, a first capacitor connected between said first input and an input terminal, a feedback path including a second capacitor connected between said second input and one terminal of a power supply, a feedback element connected between said differential amplifier output and said second input thereof for feeding-back an output of said differential amplifier to said second input, voltage divider means including an emitter follower transistor for dividing the voltage across terminals of said power supply and providing a voltage to be applied to said first input, a first resistor connected between an emitter of said emitter follower transistor and said first input, and a second resistor connected between said emitter of said emitter follower transistor and said second capacitor.

2. A differential amplifier circuit according to claim 1 wherein $R_1$ is the resistance of said first resistor, $R_2$ is the resistance of said second resistor, $C_1$ is the capacity of said first capacitor and $C_2$ is the capacity of the second capacitor, the elements having the relation $C_1 \cdot R_1 \geqslant C_2 \cdot R_2$.

3. A differential amplifier circuit according to claim 1 wherein a capacitor serving as a ripple filter is connected between said emitter of said emitter follower transistor and said one terminal of said power supply.

4. A differential amplifier circuit according to claim 3, wherein $R_1$ is the resistance of said first resistor, $R_2$ is the resistance of said second resistor, $C_1$ is the capacity of said first capacitor and $C_2$ is the capacity of said second capacitor, the elements having the relation $C_1 \cdot R_1 \geqslant C_2 \cdot R_2$.

* * * * *